United States Patent
Plumb et al.

(10) Patent No.: US 11,207,747 B2
(45) Date of Patent: Dec. 28, 2021

(54) SHAPED WELDING HEAD FOR ELECTRON OR LASER BEAM WELDING

(71) Applicant: AQUASIUM TECHNOLOGY LIMITED, Waterbeach (GB)

(72) Inventors: Paul Plumb, Waterbeach (GB); Conrad Dumont, Waterbeach (GB)

(73) Assignee: AQUASIUM TECHNOLOGY LIMITED, Waterbeach (GB)

( * ) Notice: Subject to any disclaimer, the term of this patent is extended or adjusted under 35 U.S.C. 154(b) by 603 days.

(21) Appl. No.: 16/307,717

(22) PCT Filed: Jun. 6, 2017

(86) PCT No.: PCT/GB2017/051626
§ 371 (c)(1),
(2) Date: Dec. 6, 2018

(87) PCT Pub. No.: WO2017/212240
PCT Pub. Date: Dec. 14, 2017

(65) Prior Publication Data
US 2019/0262931 A1 Aug. 29, 2019

(30) Foreign Application Priority Data

Jun. 8, 2016 (GB) .................................. 1609995
Nov. 21, 2016 (GB) .................................. 1619607

(51) Int. Cl.
*B23K 15/06* (2006.01)
*B23K 26/12* (2014.01)
(Continued)

(52) U.S. Cl.
CPC ............ *B23K 15/06* (2013.01); *B23K 15/002* (2013.01); *B23K 15/0046* (2013.01);
(Continued)

(58) Field of Classification Search
CPC .... B23K 15/06; B23K 15/0046; B23K 26/21; B23K 26/702; B23K 26/1224;
(Continued)

(56) References Cited

U.S. PATENT DOCUMENTS 3,219,792 A * 11/1965 Pederson ............... B23K 15/06
                                                    219/121.22
3,301,993 A *  1/1967 Boyd .................... B23K 15/06
                                                    219/121.13
(Continued)

FOREIGN PATENT DOCUMENTS

DE         209048     4/1984
DE        3317469     8/1984
(Continued)

OTHER PUBLICATIONS

Int'l Search Report and Written Opinion issued in App. No. PCT/GB2017/051626 (2017).
Search Report issued in United Kingdom App. No. 1708966.5(2017).

*Primary Examiner* — David A Vanore
(74) *Attorney, Agent, or Firm* — Barnes & Thornburg LLP

(57) ABSTRACT

A welding head for a welding apparatus, the head comprising an outer face attachable to a welding device such as an electron beam gun or laser, an inner face sealable to a workpiece, and an outer sealing ring and an inner sealing ring situated within the inner face and disposed on either side of an evacuatable region, wherein the inner face has a teardrop-shaped profile. Outer and inner sealing rings can be inflatable or formed from different materials, the outer sealing ring being formed from a material with a Shore hardness of between 50 to 70 and the inner sealing ring being formed from a material with a Shore hardness of 20 to (Continued)

40. A bridging seal can extend from within the inner sealing ring to the outer sealing ring.

27 Claims, 5 Drawing Sheets

(51) Int. Cl.
| | |
|---|---|
| *B23K 26/14* | (2014.01) |
| *H01J 37/18* | (2006.01) |
| *H01J 37/244* | (2006.01) |
| *B23K 26/21* | (2014.01) |
| *B23K 26/282* | (2014.01) |
| *B23K 15/00* | (2006.01) |
| *H01J 37/315* | (2006.01) |
| *B23K 26/70* | (2014.01) |

(52) U.S. Cl.
CPC ...... *B23K 26/1224* (2015.10); *B23K 26/1462* (2015.10); *B23K 26/21* (2015.10); *B23K 26/282* (2015.10); *B23K 26/702* (2015.10); *H01J 37/18* (2013.01); *H01J 37/244* (2013.01); *H01J 37/315* (2013.01); *H01J 2237/18* (2013.01); *H01J 2237/3104* (2013.01)

(58) Field of Classification Search
CPC ............ B23K 26/1462; B23K 26/282; B23K 15/002; B23K 26/706; B23K 15/0026; B23K 26/0096; B23K 37/0211; B23K 37/0276; B23K 37/0282; H01J 37/18; H01J 37/244; H01J 37/315; H01J 2237/18; H01J 2237/3104
See application file for complete search history.

(56) References Cited

U.S. PATENT DOCUMENTS

| | | | | |
|---|---|---|---|---|
| 3,435,185 | A | | 3/1969 | Gerard |
| 3,493,711 | A | * | 2/1970 | Louis ............... B23K 15/06 219/72 |
| 4,080,526 | A | | 3/1978 | Kihara et al. |
| 4,577,087 | A | * | 3/1986 | Chadwick ......... B23K 26/103 219/121.63 |
| 5,391,879 | A | * | 2/1995 | Tran ................. G01T 1/2018 250/367 |
| 5,453,617 | A | * | 9/1995 | Tsuneta ............. H01J 37/252 250/311 |
| 5,519,227 | A | * | 5/1996 | Karellas ............. G01T 1/202 250/370.11 |
| 5,572,034 | A | * | 11/1996 | Karellas ............. G01T 1/2018 250/367 |
| 5,596,198 | A | * | 1/1997 | Perez-Mendez ...... G01T 1/1642 250/363.02 |
| 5,938,954 | A | * | 8/1999 | Onuma ............. B23K 26/1224 219/121.84 |
| 6,121,622 | A | * | 9/2000 | Beyne ................ H01J 47/02 250/338.4 |
| 6,362,482 | B1 | * | 3/2002 | Stettner ............. G01T 1/1644 250/370.08 |
| 6,362,484 | B1 | * | 3/2002 | Beyne ................ G01T 1/2935 250/338.4 |
| 6,765,609 | B1 | * | 7/2004 | Kinoshita ........... G01J 3/2823 250/390.07 |
| 7,626,763 | B2 | * | 12/2009 | Harrison ............ F16P 1/02 160/229.1 |
| 9,202,669 | B2 | * | 12/2015 | Hirato ............... H01J 37/1478 |
| 11,099,282 | B2 | * | 8/2021 | Nelson .............. A61B 6/4085 |
| 2002/0088940 | A1 | * | 7/2002 | Watanabe .......... H01J 37/224 250/310 |
| 2003/0169847 | A1 | * | 9/2003 | Karellas ............. A61B 6/482 378/98.3 |
| 2004/0000630 | A1 | * | 1/2004 | Spartiotis ........... G01T 1/2964 250/208.1 |
| 2006/0081562 | A1 | * | 4/2006 | Causte .............. B23K 26/1476 219/75 |
| 2007/0175874 | A1 | | 8/2007 | Beeson et al. |
| 2010/0102041 | A1 | * | 4/2010 | Will .................. B23K 26/12 219/121.64 |
| 2011/0309236 | A1 | * | 12/2011 | Tian ................. H01L 27/14687 250/208.1 |
| 2013/0026143 | A1 | * | 1/2013 | Samartsev ......... B23K 26/244 219/121.64 |
| 2014/0262155 | A1 | * | 9/2014 | Miller ............... B23K 37/003 165/104.11 |
| 2015/0001411 | A1 | * | 1/2015 | Friedman ........... G01T 1/2935 250/375 |
| 2015/0041649 | A1 | * | 2/2015 | Wang ................ H01J 37/222 250/310 |
| 2015/0129557 | A1 | * | 5/2015 | Miller ............... B23K 9/173 219/61.7 |
| 2015/0258633 | A1 | * | 9/2015 | Hori ................. B23K 15/04 228/47.1 |
| 2015/0276947 | A1 | * | 10/2015 | Hoenk ............... G01T 1/248 250/363.03 |
| 2016/0064184 | A1 | * | 3/2016 | Brown .............. H01L 27/1464 250/307 |
| 2016/0148780 | A1 | * | 5/2016 | Agrawal ............ H01J 37/244 250/307 |
| 2017/0036305 | A1 | * | 2/2017 | Wang ................ B23K 37/006 |
| 2017/0178862 | A1 | * | 6/2017 | Ogasawara ......... H01J 37/153 |
| 2018/0073866 | A1 | * | 3/2018 | Tarabrin ............ G01B 11/272 |
| 2018/0107124 | A1 | * | 4/2018 | Tukker .............. G01B 11/272 |
| 2018/0254167 | A1 | * | 9/2018 | Zhao ................ H01J 37/28 |
| 2018/0348645 | A1 | * | 12/2018 | Ravensbergen ..... G01B 11/272 |
| 2019/0004437 | A1 | * | 1/2019 | Bhattacharyya .... G03F 7/70058 |
| 2019/0262931 | A1 | * | 8/2019 | Plumb .............. B23K 15/0046 |
| 2021/0223412 | A1 | * | 7/2021 | Gu ................... G01T 1/20181 |

FOREIGN PATENT DOCUMENTS

| | | |
|---|---|---|
| GB | 1087018 | 10/1967 |
| GB | 1151462 | 5/1969 |
| GB | 1353731 | 5/1974 |
| GB | 1530977 | 11/1978 |
| GB | 1604654 | 12/1981 |
| JP | S54-161554 | 12/1979 |

\* cited by examiner

SHAPED WELDING HEAD FOR ELECTRON OR LASER BEAM WELDING

CROSS REFERENCE TO RELATED APPLICATIONS

This application is a U.S. nationalization under 35 U.S.C. § 371 of International Application No. PCT/GB2017/051626, filed Jun. 6, 2017, which claims priority to United Kingdom Patent Application No. 1609995.4, filed Jun. 8, 2016, and United Kingdom Patent Application No. 1619607.3, filed Nov. 21, 2016. The disclosures set forth in the referenced applications are incorporated herein by reference in their entireties.

FIELD OF THE INVENTION

This invention relates to a welding head used in electron beam and laser welding, and in particular a welding head for external welding of large items such as large tubular steel sections used for wind turbines and oil pipelines.

BACKGROUND TO THE INVENTION

Electron beam welding and laser welding create a high quality weld and are often used to weld small items where rapid throughput is required or to weld complex workpieces. Welding takes place in an evacuated chamber containing the workpiece.

Conventionally large thick sectioned tubular cylinders for pipelines and the like have been welded using arc welding, but multiple passes of a welding head are required to weld the full depth of the joint. After each pass, non-destructive testing is required to ensure the weld meets quality standards with no inclusions or fractures that might cause failure of the weld. Arc welding is thus a slow and laborious process for welding such tubular structures.

It is the aim of the present invention to provide a weld head to allow electron beam and laser welding to take place under vacuum on large metal structures.

SUMMARY OF THE INVENTION

In accordance with a first aspect of the present invention, there is provided a welding head comprising an outer face attachable to a welding device, such as an electron beam gun or laser, and an inner face sealable to a workpiece with first and second annular channels formed in the inner face and disposed on either side of an evacuatable region, wherein an outer sealing ring is located in the first annular channel and an inner sealing ring is located within the second annular channel and the inner face is formed with a teardrop-shaped profile. To create the teardrop-shape, typically a larger diameter semi-circular end portion is connected to a smaller semi-circular end portion by substantially straight wall sections so as to create a teardrop-shape with a broad end and a narrow end, each end being substantially semi-circular, with the broad end having a greater radius than the narrow end. Thus each end has a circular arc of a different radius. Typically the workpiece will be a large tubular section or extensive flat plates typically having a wall thickness of between 40 to 300 mm.

The inner and outer sealing rings may be teardrop-shaped, with a broad end and a narrow end, each end being substantially semi-circular, with the broad end having a greater radius than the narrow end.

The teardrop-shape enables part of the sealing rings to be displaced longitudinally from a weld region. This is of advantage in use as the weld region has a chance to cool before the seals pass over the weld region as the head moves along a joint being welded. In use, preferably the head will be arranged such that the broad end is at the front, and the narrow region at the rear of the head as it moves. In such an arrangement, preferably a welding device is associated with the front, broad portion of the inner face.

The inner and outer sealing rings are preferably teardrop-shaped, and may have a constant wall width, with the width of the wall partially extending across the inner face. Both rings may be formed from High Temperature High Tear silicone.

If desired, the inner sealing ring having a teardrop-shape may be formed with a heel portion in the narrow end, thus providing a region of increased wall width which has greater resistance to heat from a weld.

At least one bridging seal may be provided extending from within the inner sealing ring to at least the outer sealing ring, and desirably extending beyond the outer sealing ring. The bridging seal may act as a sacrificial element to reduce wear and tear on the sealing rings.

The inner and outer sealing rings may be inflatable, with pressure applied to the seals altered to adjust the fit of the sealing rings to a surface to be welded. This may be achieved by each of the inner and outer sealing rings being formed from upper and lower seals overlying each other, the lower seal being inflatable, typically in response to an actuator which continually adjusts the inflation pressure of the lower seal.

Either or both of the inner and outer sealing rings may be formed from overlying upper and lower seal elements having different material properties and preferably the upper sealing element is formed from a material with a Shore hardness of between 50 to 70, with the material of the lower sealing element preferably being formed from a material with a Shore hardness of 20 to 40, and more preferably a Shore hardness of 34, such as High Temperature High Tear silicone. This ensures the upper sealing element, which in use contacts the workpiece, is more robust and resistive to damage with the lower sealing element providing flexibility to allow the seals to deform in response to surface imperfections of a workpiece.

The outer and inner sealing rings may be selected to have different hardnesses. The outer sealing ring may be formed from a material with a Shore hardness of between 50 to 70, with the material of the inner sealing ring preferably being formed from a material with a Shore hardness of 20 to 40, and more preferably a Shore hardness of 34, such as High Temperature High Tear silicone. The outer ring is more resistant to surface imperfections and debris which the outer ring encounters before the inner ring as the head travels along a workpiece. The less hard inner sealing ring is able to form to a workpiece surface, so providing enhanced sealing and making it easier to obtain a vacuum in the evacuatable region.

Preferably the outer sealing ring and inner sealing ring are formed from self-lubricating material that generates its own lubrication. This assists the rings to slide relative to a workpiece surface.

A channel may extend through the outer and inner face to provide a conduit for a welding beam to reach a weld joint, with the channel preferably being evacuatable so that air can be pumped from the channel and a vacuum created in the channel. This is particularly appropriate where the welding device is an electron beam device or laser requiring a vacuum for welding to take place.

An elongate groove may extend across the inner face from the channel to at least the inner sealing ring. This allows a weld bead to locate within the groove as the head travels along the weld joint and ensures the inner sealing ring is not subjected to sudden changes in the workpiece surface profile which might tear the inner sealing ring or affect the seal with the workpiece.

In accordance with another aspect of the invention, there is providing welding apparatus comprising a welding head as aforesaid attached to a welding device such as an electron beam gun or laser.

The welding apparatus may further comprise a sealing device, typically in the form of a back box seal, for attaching to a rear wall of a workpiece being welded, the sealing means being arranged to be behind the region being welded, such that the welding head provides an evacuatable region on a front wall of a workpiece and the sealing means provides an evacuatable region on a rear wall of a workpiece so as to ensure that welding devices in the form of electron beam gun or lasers can operate within a vacuum.

In such an apparatus, preferably the welding head is moveable relative to a workpiece, to allow radial and/or circumferential welding of tubular workpieces or linear welding of flat plates. The head may be moveable along a fixed track, with the workpiece remaining stationary, or alternatively the head main remain stationary with the rotation of the workpiece. For particularly heavy tubular sections, typically the head will be moveably located on an annular track extending around the tubular workpiece.

The sealing means may further comprise a blocking bar, typically made of metal, and arranged to block the passage of electron beams during welding, such that the blocking bar extends along the length of the sealing means so as to be disposed behind a welding joint throughout the welding process. The sealing means may be moveable to track the movement of the welding head, and so remain situated behind the weld region.

The sealing means may further comprise a detector so as to detect characteristics of electrons at the rear of the weld site.

The invention will now be described, by way of example, and with reference to the accompanying drawings, in which.

DESCRIPTION

Figure 1:
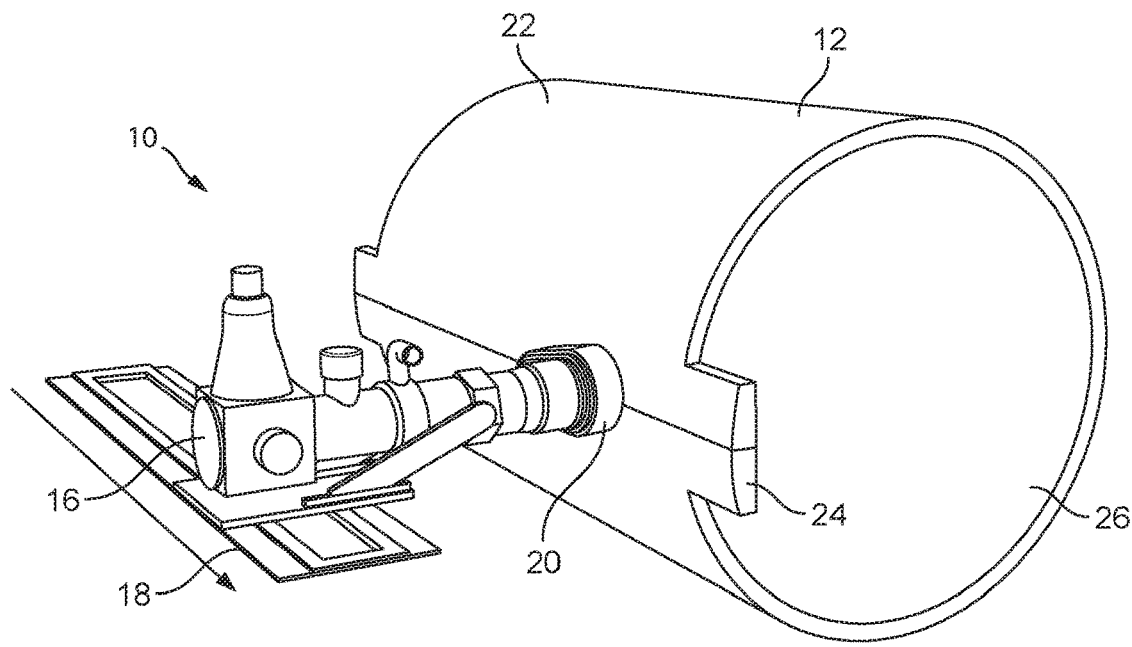
FIG. 1 is a perspective view of pipe welding apparatus embodying the invention.

FIG. 1 shows welding apparatus 10 used to weld a large thick sectioned tubular cylinder 12. The cylinder is a rolled tubular piece which requires welding along linear joint 14 to secure the tube into its circular shape. Electron beam gun 16 is moveably mounted on a carriage 18 so as to be able to travel smoothly parallel to joint 14 and continuously weld extended lengths, i.e. lengths of over 2 metres. Sealing head 20 associated with gun 16 slideably secures to an outer surface 22 of pipe 12 allowing a vacuum to be created at weld joint 14 and so allow electron beam welding to take place. An internal back box seal 24 extends along joint 14 on internal wall 26 so that a vacuum can be maintained at the rear of weld joint 14.

The present invention is particularly useful for large tubular sections of 50 to 300 mm wall thickness and of large diameter, typically 0.5 to 3 m, although it can also be used for welding flat large sections. The single welding head is able to achieve the full depth of the weld in one pass, welding from one side only, and is capable of continuous linear welding without interruption for lengths exceeding 40 m. Such large tubular sections are typically used in oil pipelines, wind turbines and other heavy engineering applications.

Figure 2:
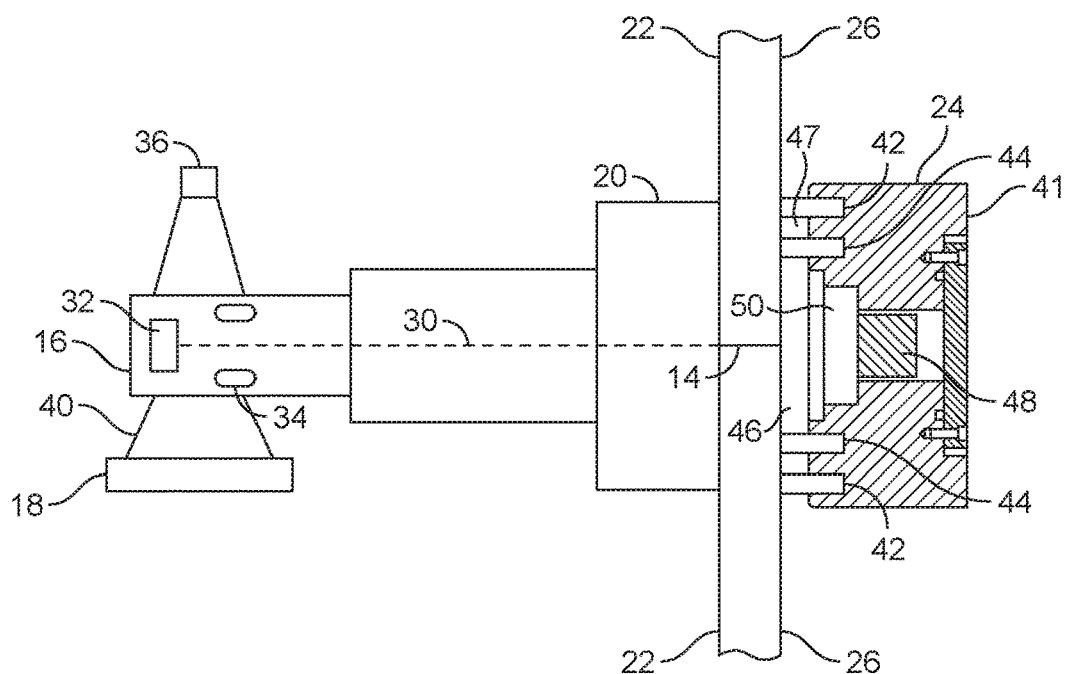
FIG. 2 is an illustrative cross-section of the pipe welding apparatus.

FIG. 2 shows an illustrative cross section of the arrangement shown in FIG. 1. Electron gun 16 generates an electron beam 30 from cathode 32, with beam 30 deflected to weld along joint 14 by adjusting the magnetic field of electromagnetic coils 34. Window 36 allows viewing of a chamber within which cathode 32 and coils 34 are located. Gun 16 is attached to mount 40 which enables slidable movement of gun 16 along carriage 18. Back box seal 24 comprises casing 41 in which are located seals 42, 44 which partially extend from casing 41 to define a rectangular region 46 and rectangular annulus 47 from which air is pumped to create a vacuum behind joint 14 on internal wall 26.

To prevent electron beam 30 travelling beyond cylinder 12, beam blocker 48 in the form of a thick metal rectangular bar extends along the length of back box seal 24 and is positioned directly behind weld joint 14. If desired, a detector 50 can be located within back box seal 24 so as to provide feedback information on the characteristics of the electron beam, such as beam penetration energy, after the beam has passed through joint 14. The vacuum generated at the front and rear of weld 14 must be approximately the same pressure to prevent pressure differentials affecting the molten weld bead as welding takes place. Too high a pressure in back box 24 compared to head 20 will cause the weld pool to flow towards the front of tube 12, causing poor welds with defects such as multiple holes and inclusions.

In electron beam welding, the metal either side of the joint is fused together without the need for any fillers or flux. A joint extending through the full depth of the wall is achieved in a single pass, contrasting with arc welding where ninety passes of the same joint are required to weld a region 100 mm deep. This gives a much faster throughput, particularly given the electron beam welds do not need to be tested for hydrogen cracking or flux particles in the weld. With an electron beam weld, a linear section of around 1.3 m in length with a wall thickness of 60 mm can be welded in six minutes and a weld speed of 200 mm per minute can be achieved for 150 mm thick steel.

Different embodiments of head 20 will now be discussed with relation to FIGS. 3 to 6.

Figure 3:
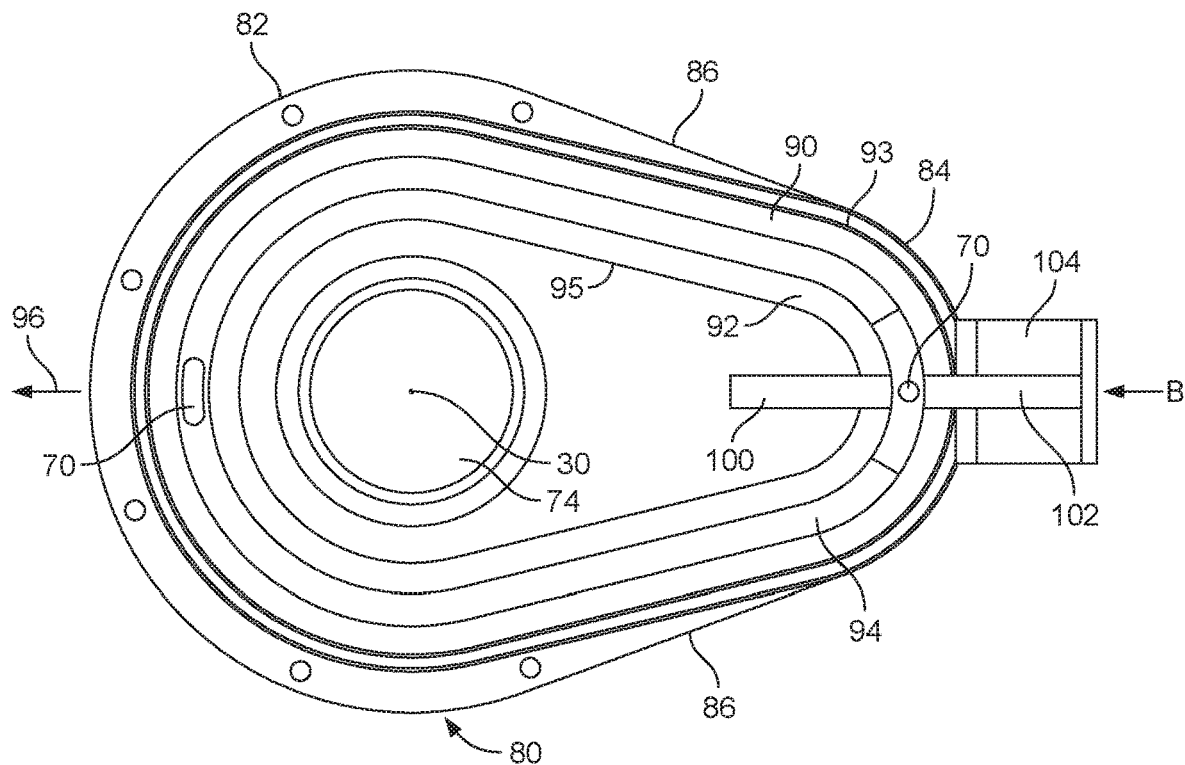
FIG. 3 is a cross-section of a first embodiment of a welding head.
Figure 4:
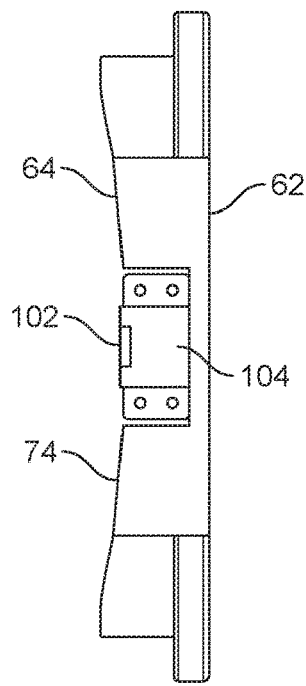
FIG. 4 is an end view from direction A of FIG. 3.

FIGS. 3 and 4 show a teardrop-shaped head 80 having an outer face 62 for attachment to electron gun 16 and a teardrop-shaped inner face 64 for sealing against pipe 12. Teardrop-shaped seals 90, 92 with a wall width of around 20 mm are disposed within annular depressions or channels 93, 95 either side of pumping outlets 70 associated with teardrop-shaped channel 94. When positioned against outer wall 22 of pipe 12, seals 90, 92 form an airtight seal allowing air to be continually pumped from between seals 90, 92 and a rough vacuum obtained within gap 94. Channel 74 also has air pumped from it, such that there are two regions of vacuum, a high vacuum of around $10^{-2}$ mBar associated with channel 74 and electron gun 16 and a coarse or rough vacuum of 0.1 to 10 mBar associated with region 94 defined between seals 90 and 92.

Head 80 is shaped to approximately match the curvature of pipe 12 and so has a slight curve to internal face 64. This curve does not need to match the profile of tubular section 12 as seals 90, 92 located within channel 93, 95 can accommodate a slight variation between the profiles of internal face 64 and tubular section 12. Typically tubular section 12 will be of such a great diameter that internal face 64 is almost planar.

Seals 90 and 92 are formed from plastics materials or rubber and selected to have different material properties, and in particular different hardnesses. Outer seal 90 is required to be robust as the forces on the travelling front edge of head 20 cause a lot of drag tearing at the seal and also seal 90 will encounter roughness and imperfections along the surface of tube 12 as head 80 is slid along joint 14. Inner seal 92 encounters fewer imperfections as debris and some surface roughness will have been removed or abraded by outer seal 90 passing over the surface first. The material for seal 90 is selected to be harder and more rigid than that of seal 92, with the material for seal 92 being more pliable and flexible. Seals 90, 92 are typically between 10 to 30 mm wide, with seal 90 having a Shore hardness of between 50 to 70, and desirably 60. Seal 92 is selected to have a Shore hardness of around 20 to 40, and in particular selected to be closed cell silicone with a Shore value of 34 and in particular high temperature high tear (HTHT) silicone rubber sponge. Too low a Shore value would result in seal 92 collapsing after a short weld distance. Desirably the material of the seals is self-lubricating which improves ease of movement of head 20.

By using seals with different hardnesses, sealing around weld joint 14 by seal 92 is optimised as the lower Shore value seal is compliant and able to shape itself to the cylinder surface, ensuring a high vacuum can be achieved in central channel 74 without needing to make a seal with a profile matching that of wall 22, whilst the harder outer seal 90 is able to resist imperfections, is resistant to tearing and has a protective effect for the softer seal.

If both seals were selected to have a high Shore value, then obtaining a seal against cylinder wall 22 would be difficult due to the rigidity of both seals and it would be very difficult to achieve a vacuum in region 94. By having a pair of spaced apart annular seals with different material properties, consistent vacuum levels in the $10^{-2}$ mBar range are achievable in inter-space region 94 as travel of head 80 occurs along weld joint 14.

The proximity of inner seal 92 to the central weld position can result in seal failure due to the heat of the weld, particularly if the power of the electron beam is raised above 60 mA. Head 80 is thus formed with a teardrop-shape to provide more distance between inner seal 92 and the completed hot welded joint and typically is situated at least 100 mm from weld centre 30 to the rear end of inner seal 92, and more preferably around 185 mm. A larger diameter semi-circular end portion 82 is connected to a smaller semi-circular end portion 84 by substantially straight wall sections 86 so as to create a teardrop-shape with each end having a circular arc of a different radius.

Between seals 90, 92 is defined a teardrop-shaped channel of constant wall width connected to pumping conduit 70 so that air can be continually pumped from between seals 90, 92 and a rough vacuum obtained in region 94. The narrower rear ends of seals 90, 92 are spaced from electron beam 30 and the corresponding weld region by a much greater distance than if a circular head were used. Direction of travel of head 80 along weld 14 is shown by arrow 96 with the broader end portion 84 being the front of the teardrop as movement occurs. By adopting the substantially teardrop-shape, the newly welded region is able to cool slightly before the rear ends of seals 90, 92 pass over the weld. This reduces the amount of heat that seals 90, 92 are exposed to and improves their longevity and thus the welding distance they can remain operational for.

To further improve the distance that the head can weld before failure of the seals, head 80 includes elongate inner and outer bridging seals 100, 102, placed at the rear of portion 86 and arranged to extend along the direction of travel 96. The bridging seals 100, 102 are typically made of PTFE and improve the sealing achievable on rough surfaces whilst providing sacrificial areas to absorb heat from the weld region before the inner seal or outer seal pass over the weld region. To accommodate outer bridging seal 102, a tail portion 104 is added to the rear portion 86 of the teardrop profile. With such an arrangement, welding distances of around 48 meters have been achieved without the seals breaking.

Figure 5:
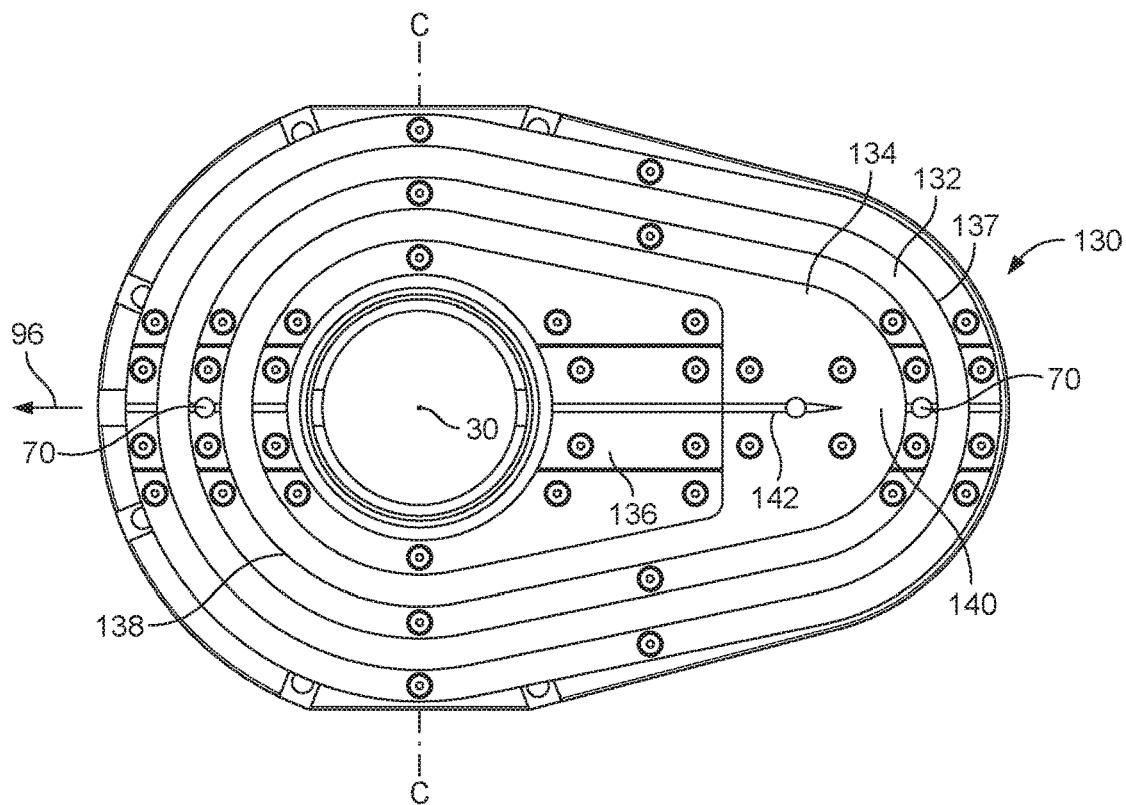
FIG. 5 is an end view of a second embodiment of a welding head.
Figure 6:
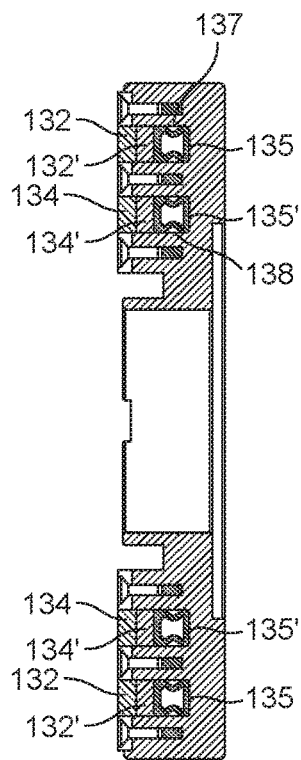
FIG. 6 is a cross-section along line C of FIG. 5.

A further embodiment of a head is shown in FIGS. 5 and 6, this embodiment being particularly suitable for welding flat plate sections. Head 130 is provided with inflatable seals 132, 134 made from HTHT silicone with inter-space pumping provided through conduits 70. Inner face 136 of head 130 is moulded from PTFE material so that the head has improved glide characteristics over a workpiece and thus seals 132, 134 will be positioned within annular depressions or channels 137, 138 formed in the PTFE structure of the inner face.

For the teardrop-shaped embodiment shown in FIG. 5, outer seal 132 is teardrop-shaped having a constant wall width. Inner seal 134 has an outer wall that corresponds to the teardrop profile and has a constant wall width in the larger diameter portion of the teardrop profile but has a thickened heel section 140 which is substantially semi-circular in the smaller end portion 84. Inner seal 134 thus is substantially widened along the direction of travel 96 so that it can resist heat generated at weld site 30 for longer before failure.

To further assist with reducing the effect of a hot weld on seal 134, a lead channel 142 is formed in the direction of travel within both PTFE inner face 136 and in the heel portion 140 of inner seal 134. Lead channel 142 ensures that weld beads formed at weld site 30 are accommodated and do not exert pressure on seal 134.

Seals 132 and 134 are inflatable and are responsive to an actuator [not shown] to adjust their position relative to the surface being welded. Inflatable seals 135, 135' are located beneath seals 132, 134. The actuator detects the pressure exerted on the seals 132, 134 by any irregularities in the workpiece surface and adjusts the pressure applied to inflatable seals 135, 135' so as to alter the position of seals 132, 134 relative to the surface. This ensures the outermost seals form to the surface whilst retaining their ability to slide along the surface. Thus seals 132, 134 are active seals, continually adjusting to the surface profile of the workpiece as head 130 moves.

If desired, seals 132, 134 can either or both consist of a double seal formed by two overlying seals of different Shore values. Thus outer seal 134 can be located on a lower seal 134' disposed above inflatable seal 135, with outer seal 134 formed from a material with a Shore hardness of between 50 to 70, and lower seal 134' formed from a material with a Shore hardness of 20 to 40, and typically a Shore hardness of 34, such as High Temperature High Tear silicone. This ensures the outer part of the seal, seal 134, which in use contacts the workpiece, is more robust and resistive to damage with the lower sealing element providing flexibility to allow the seals to deform in response to surface imperfections of a workpiece and in response to adjustment of inflatable seal 135'. Similarly seal 132 can be formed with an outer harder seal with a Shore hardness of between 50 to 70 and a more pliable lower seal 132' with a Shore hardness of 20 to 40.

As with the embodiment shown in FIG. 3, an outer bridging seal can be introduced, either as a separate seal or by forming a second lead channel extending across inner face 136 across outer seal 132 in a manner similar to the embodiment shown in FIG. 3.

By using a PTFE front face against the work surface, the head glides across the surface better and is able to absorb downward forces from the vacuum, ensuring the force on the seals is reduced. Better control of the inflatable seals is also possible. If desired, a PTFE front face can be used for the embodiment shown in FIGS. 3 and 4.

Figure 7:
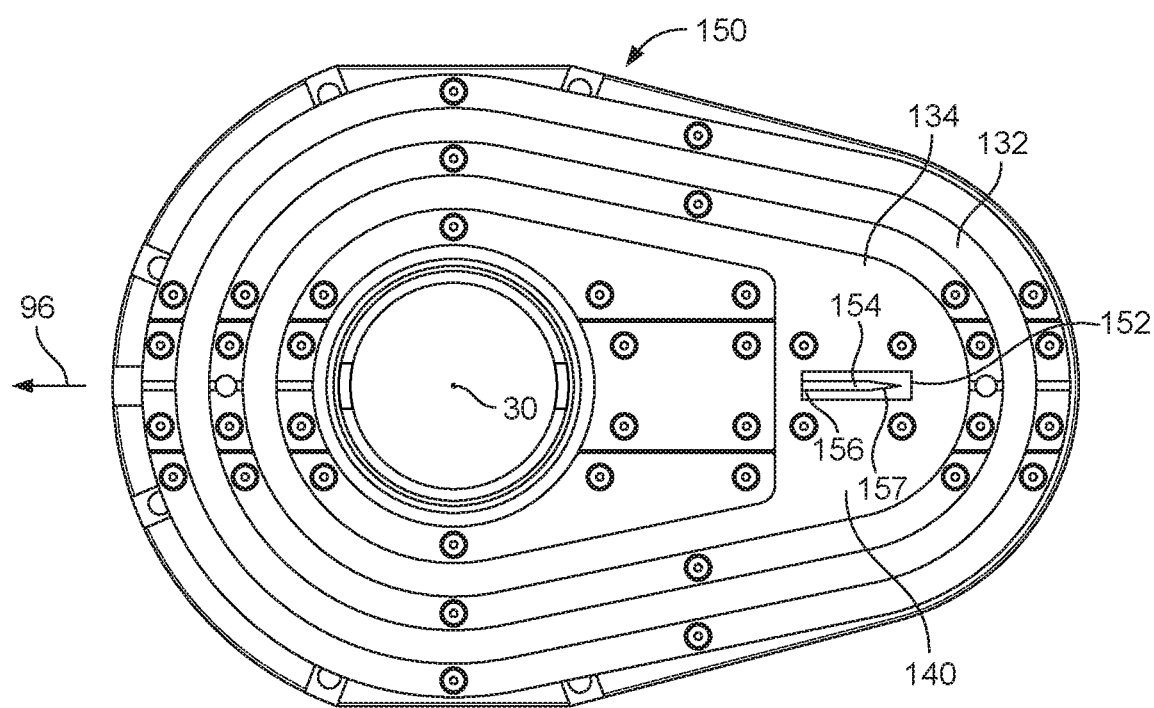
FIG. 7 is an end view of a third embodiment of a welding head.

A further embodiment is shown in FIG. 7 where head 150 uses a sacrificial element 152 within thickened heel section 140 instead of lead channel 142. Sacrificial element 152 is rectangular in shape with a centrally placed groove 154 and is detachably locatable within a co-operating aperture in heel section 140 by virtue of a push-fit connection. Typically sacrificial element 152 is formed from the same material as the remainder of heel section 140.

Sacrificial element 152 is centrally located on the axis of travel of head 150, with the direction of travel of weld head 150 indicated by arrow 96. Groove 154 is typically around 10 mm wide and 5 mm deep at end 156 where the newly-created weld joint first encounters the sacrificial element and at the end furthest from weld point 30, the groove has a tapered section 157 which tapers in both width and depth so as to eventually lead into the surrounding surface 140.

As the weld joint is created and head 150 travels in the direction of arrow 96, the weld bead is received within and beds into the deepest end 156 of groove 154. The gradual tapering of groove 154 allows the narrower end of head 150 to travel over the weld joint easily. Sacrificial element 152 is exposed to most of the heat associated with the newly-created weld joint and will fail before the remainder of heel section 140. By having a replaceable sacrificial element, the lifetime of the heel section can be prolonged, typically lasting three times longer than if no sacrificial element is provided.

Figure 8:
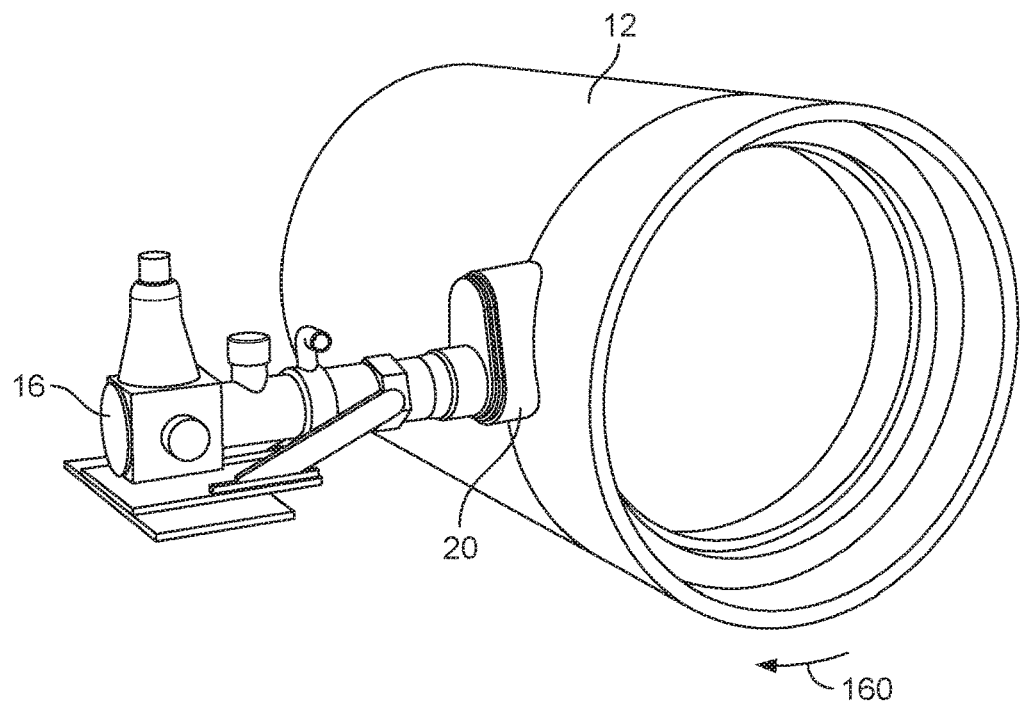
FIGS. 8 and 9 are perspective views of the pipe welding apparatus used for circumferential welding.
Figure 9:
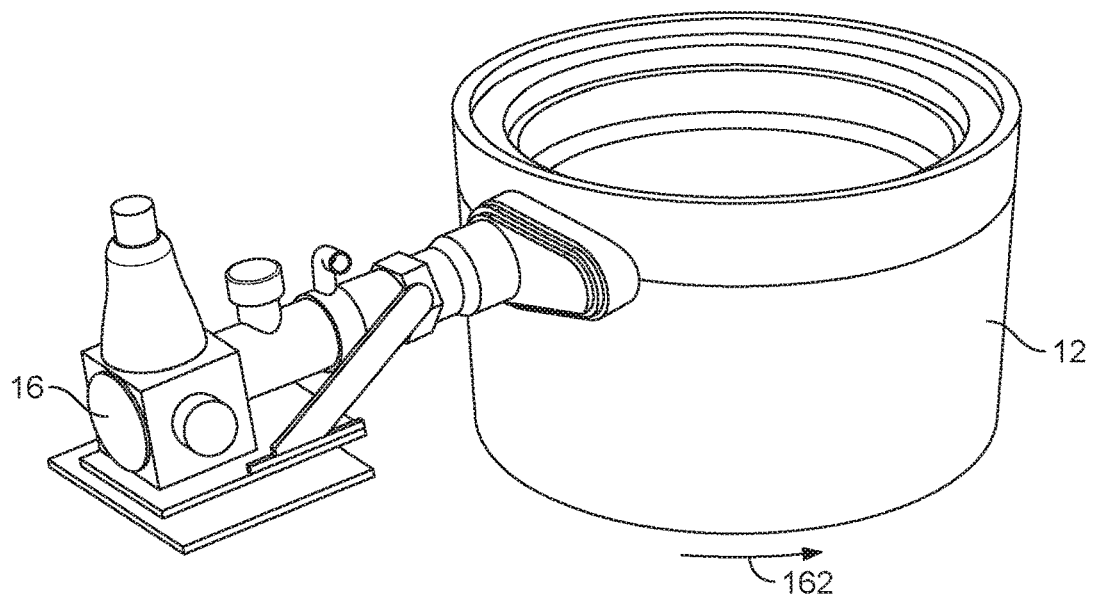

As shown in FIGS. 8 and 9, head 20, 80, 130, 150 can be deployed to weld the same large structures circumferentially, with workpieces 12 rotated under the head in either the horizontal 160 or vertical 162 plane. For very large tubular pieces, the head can be moved around a static workpiece using an annular track.

By having a local head for welding, the welding apparatus is portable, having a relatively small footprint compared to arc welding apparatus. Also the head profile can readily be customised to accommodate a variety of different cylinder shapes and profiles.

Whilst described with reference to electron beam welding, the weld head and technique described is applicable to laser welding which also preferably requires a vacuum at the weld site. The invention enables welding techniques previously used for smaller scale welds to be adapted for use with large scale workpieces given it enables a vacuum to be applied and maintained as a weld progresses over many metres.

The invention claimed is:

1. A welding head comprising an outer face attachable to a welding device and an inner face sealable to a workpiece with first and second annular channels formed in the inner face and disposed on either side of an evacuatable region, wherein an outer sealing ring is located in the first annular channel and an inner sealing ring is located within the second annular channel and the inner face is formed with a teardrop-shaped profile.

2. The welding head according to claim 1, wherein the inner and outer sealing rings are teardrop-shaped.

3. The welding head according to claim 1, wherein the inner and outer sealing rings have a constant wall width.

4. The welding head according to claim 1, wherein the inner sealing ring is formed with a heel portion providing a region of increased wall width.

5. The welding head according to claim 4, wherein the heel portion further comprises a replaceable sacrificial element.

6. The welding head according to claim 1, further comprising at least one bridging seal extending from within the inner sealing ring to the outer sealing ring.

7. The welding head according to claim 6, wherein the at least one bridging seal extends beyond the outer sealing ring.

8. The welding head according to claim 1, wherein the inner and outer sealing rings are inflatable.

9. The welding head according to claim 1, wherein the inner and outer sealing rings are formed from self-lubricating material.

10. The welding head according to claim 1, wherein the inner and outer sealing rings are formed from different materials, the material of the outer sealing ring being harder than the material of the inner sealing ring.

11. The welding head according to claim 10, wherein the outer sealing ring is formed from a material with a Shore hardness of between 50 to 70.

12. The welding head according to claim 10, wherein the material of the inner sealing ring is formed from a material with a Shore hardness of 20 to 40.

13. The welding head according to claim 1, wherein one or both of the inner and outer sealing rings is formed from overlying upper and lower sealing elements having different material properties.

14. The welding head according to claim 13, wherein the upper sealing element is formed from a material with a Shore hardness of between 50 to 70.

15. The welding head according to claim 13, wherein the lower sealing element is formed from a material with a Shore hardness of 20 to 40.

16. The welding head according to claim 1, wherein the inner sealing ring is formed from High Temperature High Tear silicone.

17. The welding head according to claim 1, wherein the outer sealing ring is formed from High Temperature High Tear silicone.

18. The welding head according to claim 1, wherein a channel extends through the outer face and the inner face to provide a conduit for a welding beam.

19. The welding head according to claim 18, wherein an elongate groove extends across the inner face from the channel to at least the inner sealing ring.

20. The welding head according to claim 18, wherein the channel is evacuatable.

21. The welding head according to claim 1, wherein the welding device is an electron beam device or laser.

22. A welding apparatus comprising a welding head according to claim 1 when attached to a welding device.

23. The welding apparatus according to claim 22, further comprising a seal adapted to be attachable to a rear wall of a workpiece being welded.

24. The welding apparatus according to claim 23, wherein the seal further comprises a blocking bar.

25. The welding apparatus according to claim 23, wherein the seal is moveable to track movement of the welding head.

26. The welding apparatus according to claim 23, wherein the seal further comprises a detector to detect characteristics of electrons at a rear of a weld site.

27. The welding apparatus according to claim 22, wherein the welding head is moveable along a fixed track.

* * * * *